United States Patent
Aochi

(10) Patent No.: US 7,088,593 B2
(45) Date of Patent: Aug. 8, 2006

(54) SHIELD CASE

(75) Inventor: Akira Aochi, Nara (JP)

(73) Assignees: Sanyo Electric Co., Ltd., Moriguchi (JP); Sanyo Tuner Industries Co., Ltd., Daito (JP)

( * ) Notice: Subject to any disclaimer, the term of this patent is extended or adjusted under 35 U.S.C. 154(b) by 186 days.

(21) Appl. No.: 10/472,193

(22) PCT Filed: Mar. 27, 2002

(86) PCT No.: PCT/JP02/03021

§ 371 (c)(1),
(2), (4) Date: Sep. 29, 2003

(87) PCT Pub. No.: WO02/080642

PCT Pub. Date: Oct. 10, 2002

(65) Prior Publication Data

US 2004/0099550 A1    May 27, 2004

(30) Foreign Application Priority Data

Mar. 29, 2001    (JP) .............................. 2001-096139

(51) Int. Cl.
*H05K 9/00* (2006.01)

(52) U.S. Cl. ...................... 361/818; 361/816; 361/800; 361/799; 174/52.2

(58) Field of Classification Search ................ 361/800, 361/818, 790, 816, 799, 752; 174/35 R, 174/51, 52.2; 439/92, 95, 607
See application file for complete search history.

(56) References Cited

U.S. PATENT DOCUMENTS

| 5,067,232 | A  | * | 11/1991 | Seidel et al. ................... 29/837 |
| 6,388,189 | B1 | * | 5/2002  | Onoue ....................... 174/35 R |
| 6,661,668 | B1 | * | 12/2003 | Weiblen ...................... 361/730 |

FOREIGN PATENT DOCUMENTS

| JP | 3-110891 | 11/1991 |
| JP | 6-203921 | 7/1994 |
| JP | 8-139487 | 5/1996 |

* cited by examiner

*Primary Examiner*—K. Cuneo
*Assistant Examiner*—Hung S. Bui
(74) *Attorney, Agent, or Firm*—Armstrong, Kratz, Quintos, Hanson & Brooks, LLP

(57) ABSTRACT

The present invention provides a shield case comprising a frame body having an interior divided by partition plates and housing electronic components therein and a closure for providing electric shield by covering an opening portion of the frame body, and having a slit piece integrally formed with the closure by cutting out a part of the closure along a periphery except for a base portion to a raised form, the slit piece for coming into contact with an end of the partition plate, the slit piece being formed in a gutter shape from the base portion to the other end. Furthermore, the slit piece has the gutter shape which becomes greater in curvature radius from the base portion to the other end.

This enables the shield case of the high-frequency device of the present invention to strengthen the contact between the slit piece formed with the closure for providing grounding and the partition plates provided within the frame body, whereby the reliable high-frequency device can be provided.

2 Claims, 3 Drawing Sheets

FIG. 1
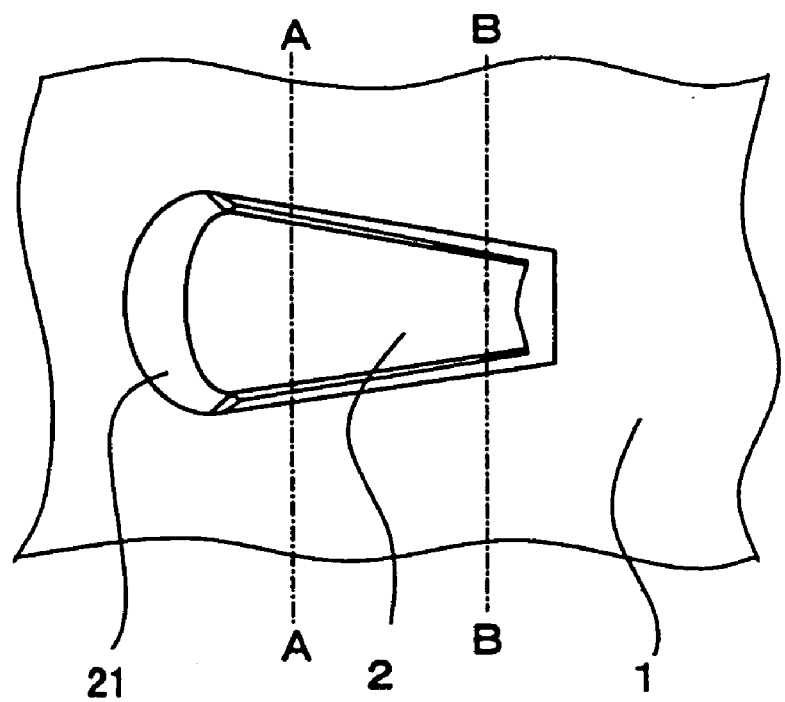
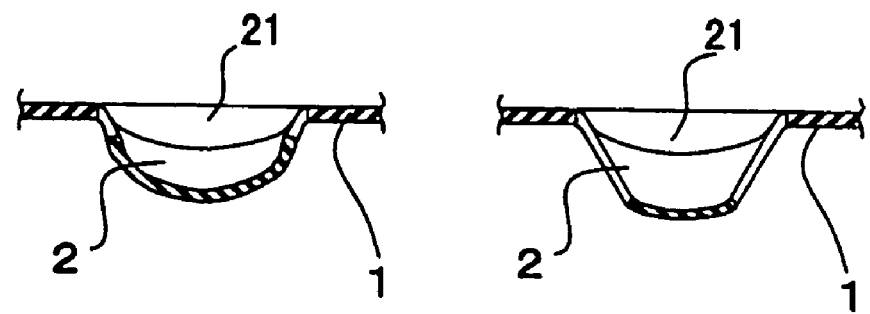
FIG. 2 (a)   FIG. 2 (b)

SHIELD CASE

TECHNICAL FIELD

The present invention relates to shield cases for use in high-frequency devices utilizing high frequency circuits, such as front end modules of video devices and communications devices.

BACKGROUND ART

High-frequency devices such as front end modules of video devices and communications devices utilize high-frequency circuits to obtain circuit characteristics. An upper surface of a circuit board 4 provided within a frame body 5 is divided by a plurality of partition plates 3, as shown in FIG. 4, and an opening of the frame body 5 is covered with a closure (not shown) to provide electric shield, for preventing detrimental effect resulting from the leakage of a local oscillation signal to the other circuits, or for not affecting the high-frequency circuit due to a signal transmitted by the other device.

The closure has a plurality of slit pieces 2 integrally formed therewith by cutting out a part of the closure to a raised form as shown in FIG. 5. Each of the slit pieces 2 is cut out from the closure 1 along a periphery except for a base portion and inclines toward the interior of the frame body 5. An outer end of the slit piece 2 comes into contact with an end of the partition plate 3, as shown in FIG. 6. Accordingly the closure 1 is grounded, thereby suppressing the transmission, to the other circuits, of a local oscillation signal produced from a local oscillator (not shown) disposed on the circuit board 4.

According to the prior art described, whereas the outer end of each split piece should reliably contact with the end of the partition plate for grounding, the contact pressure thereof may drop depending on dimensional tolerance of the partition plate or on that of the slit piece, or the closure is pressed due to problem involved in handling the device to drop cut-out inclination angle of the piece, deteriorating the contact pressure. This gives rise to the problem that the closure is not reliably grounded. It is, therefore, necessary to make such a contrivance as to select a metallic material having a high elasticity as a material for use in the closure integrally formed with the slit piece, and as to allow the slit piece to have a sufficient spring force by extending the slit piece as long as possible.

However, limiting the material of the closure increases the cost of the device, and extending the slit piece hampers the high-frequency device from obtaining desired characteristics because the high-frequency device needs to be grounded in the shortest distance, and further from making the device compact.

An object of the present invention is to provide improving technique for ensuring and stabilizing the contact between the slit piece and the partition plate, and providing reliable grounding.

DISCLOSURE OF THE INVENTION

The present invention provides a shield case comprising a frame body having an interior divided by partition plates and housing electronic components therein and a closure for providing electric shield by covering an opening portion of the frame body, and having a slit piece integrally formed with the closure by cutting out a part of the closure along a periphery except for a base portion to a raised form, the slit piece for coming into contact with an end of the partition plate, the shield case being characterized in that the slit piece is formed in a gutter shape from the base portion to the other end.

Furthermore, the slit piece has the gutter shape which becomes greater in curvature radius from the base portion to the other end.

According to the present invention, a slit piece 2 of the present embodiment is formed in the gutter shape in an extending direction, increasing the slit piece in strength, thereby improving restoring force against deformation of the slit piece 2 when the closure 1 of the shield case formed with the slit piece 2 is pressed. This eliminates the problem that pressing the closure 1 drops cut-out inclination angle of the slit piece 2, deteriorating contact pressure thereof, not to provide sufficient grounding.

BRIEF DESCRIPTION OF THE DRAWINGS

FIG. 1 is a fragmentary plan view showing an embodiment of a shield case of the present invention;

FIG. 2 is a view in cross section along A—A and B—B of the shield case of FIG. 1;

BEST MODE OF CARRYING OUT THE INVENTION

With reference to the drawings an example of the present embodiment will be described below. FIG. 1 is a fragmentary plan view of the shield case of the present invention. FIGS. 2(*a*), (*b*) are views in cross section along A—A and B—B, respectively.

Indicated by (1) of FIG. 1 is a closure of the shield case. Indicated by (2) of FIG. 1 is a slit piece which is formed by cutting out a part of the closure 1 along a periphery except for a base portion 21. The slit piece 2 is folded in the form of a curve and raised at the base portion 21, and is pressed in the form of a gutter having an U-shape in cross section as shown in FIGS. 2(*a*), (*b*).

Figure 3:
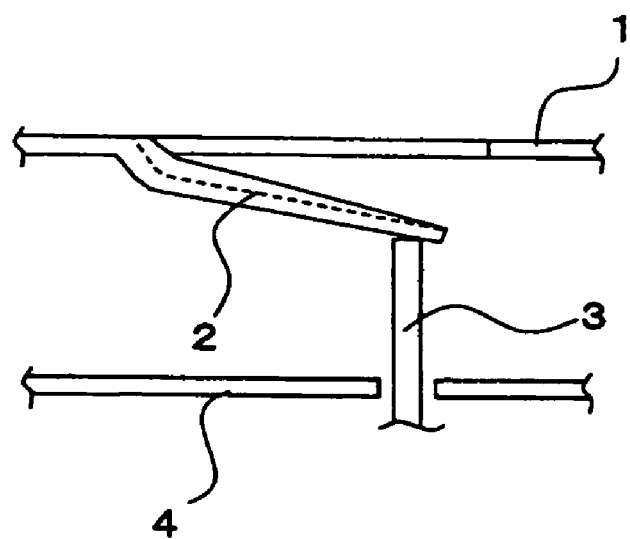
FIG. 3 is a view in cross section showing a contacting state of the slit piece of the shield case of the present embodiment.
Figure 4:
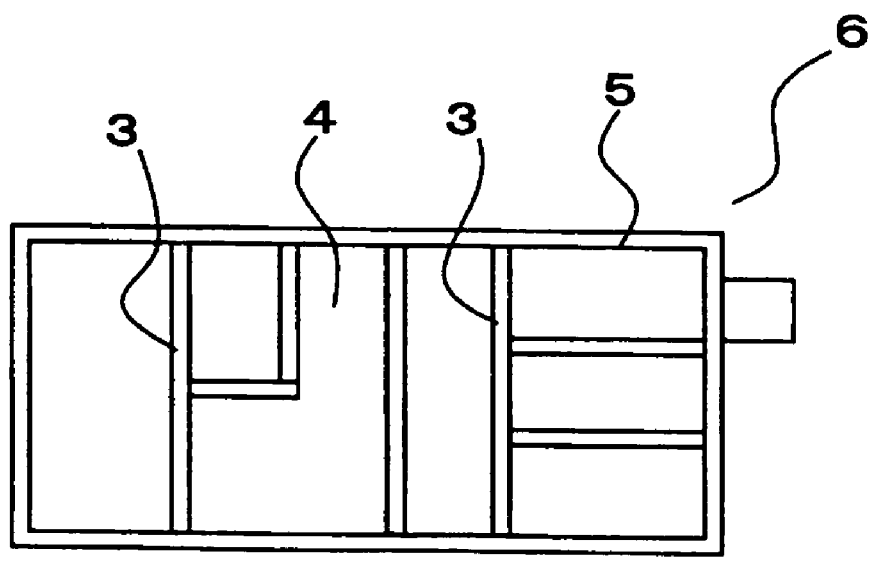
FIG. 4 is a diagram illustrating a frame body provided with the shield case.
Figure 5:
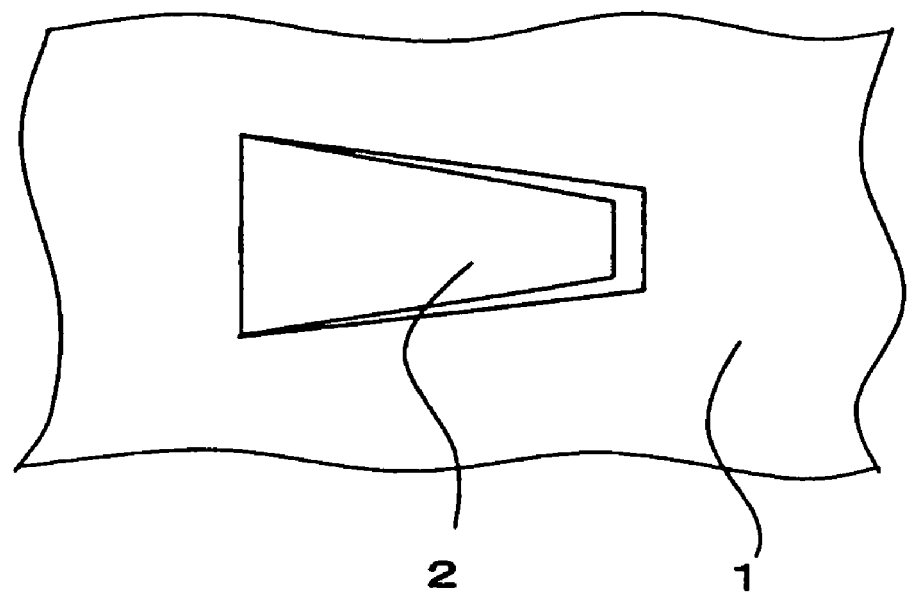
FIG. 5 is a fragmentary plan view showing a conventional shield case.
Figure 6:
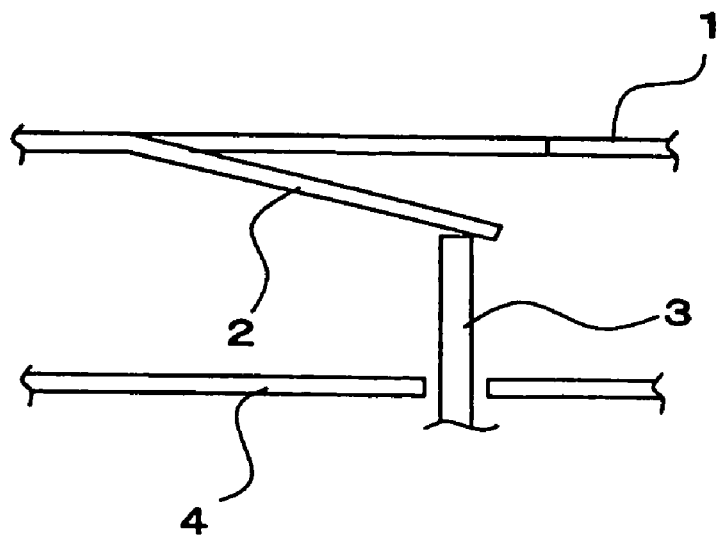
FIG. 6 is a view in cross section showing a contacting state of the slit piece of the conventional shield case of the conventional embodiment.

FIG. 3 shows a fragmentary view in cross section when the slit piece 2 of the embodiment comes into contact with a partition plate 3 of a high-frequency device. Indicated by (4) of FIG. 3 is a circuit board.

The slit piece 2 of the present embodiment is formed in a gutter shape to an extending direction, to increase the slit piece 2 in strength, thereby improving restoring force against deformation of the slit piece 2 when the closure 1 of the shield case formed with the slit piece 2 is pressed. This eliminates the problem that pressing the closure 1 drops cut-out inclination angle of the slit piece 2, deteriorating contact pressure thereof, not to provide sufficient grounding.

With the present embodiment, the gutter shape is increased in curvature radius from the base portion 21 to an outer end of the slit piece 2 as shown in FIGS. 2(*a*), (*b*), whereby while the base portion 21 is held in strength, the outer end to come into contact with the partition plate 3 can have elasticity and can stably contact with the partition plate 3. Whereas the outer end of the slit piece 2 has curvature, the outer end portion of the piece may be flat.

As described above, with the shield case of the present invention, the slit piece reliably and stably can come into contact with the partition plate to provide grounding with a simple structure wherein the slit piece integrally formed with the closure is processed into a gutter shape, so that radiation from the circuit board or inflow of disturbing wave can be suppressed to provide a reliable high-frequency device.

The invention claimed is:

1. A shield case comprising a frame body having an interior divided by partition plates and housing electronic components therein and a closure for providing electric shield by covering an opening portion of the frame body, and having a slit piece integrally formed with the closure by cutting out a part of the closure along a periphery except for a base portion to a raised form, the slit piece for coming into contact with an end of the partition plate, the shield case being characterized in that the slit piece is formed in a gutter shape in an extending direction in an inclination angle from the base portion to the other end.

2. A shield case according to claim 1 wherein the slit piece has the gutter shape which becomes greater in curvature radius from the base portion to the other end.

\* \* \* \* \*